United States Patent
Philipp et al.

(10) Patent No.: US 7,623,401 B2
(45) Date of Patent: Nov. 24, 2009

(54) SEMICONDUCTOR DEVICE INCLUDING MULTI-BIT MEMORY CELLS AND A TEMPERATURE BUDGET SENSOR

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 483 days.

(21) Appl. No.: 11/544,159

(22) Filed: Oct. 6, 2006

(65) Prior Publication Data

US 2008/0084738 A1   Apr. 10, 2008

(51) Int. Cl.
  *G11C 7/00* (2006.01)
(52) U.S. Cl. .................... 365/222; 365/163; 365/189.07
(58) Field of Classification Search .................. 365/222, 365/168, 189.07, 163
  See application file for complete search history.

(56) References Cited

U.S. PATENT DOCUMENTS

| | | | |
|---|---|---|---|
| 6,768,655 B1 | 7/2004 | Yang et al. | |
| 6,768,665 B2 * | 7/2004 | Parkinson et al. | 365/113 |
| 7,009,904 B2 * | 3/2006 | Kim | 365/211 |
| 7,027,343 B2 * | 4/2006 | Sinha et al. | 365/222 |
| 2004/0022085 A1 | 2/2004 | Parkinson et al. | |
| 2004/0151023 A1 | 8/2004 | Khouri | |

FOREIGN PATENT DOCUMENTS

EP   1 420 412   5/2004

OTHER PUBLICATIONS

Cho et al., "Highly Scalable On-axis Confined Cell Structure for High Density PRAM beyond 256Mb," VLSI, 2005. 2 pages.
Redaelli et al., "Impact of crystallization statistics on data retention for phase change memories," submitted to IEDM, 2005. 4 pages.
Itri et al., "Analysis of phase-transformation dynamics and estimation of amorphous-chalcogenide fraction in phase-change memories," IRPS, 2004. 7 pages.
Horii et al., "A Novel Cell Technology Using N-doped GeSbTe Films for Phase Changer RAM," VLSI, 2003. 2 pages.
Lai, "Current status of the phase change memory and its future," IEDM, 2003. 4 pages.
Lai et al., "OUM—A 180 nm Nonvolatile Memory Cell Element Technology for Stand Alone and Embedded Applications," IEDM, 2001. 4 pages.

* cited by examiner

*Primary Examiner*—Son Dinh
(74) *Attorney, Agent, or Firm*—Dicke, Billig & Czaja, P.L.L.C.

(57) ABSTRACT

One embodiment provides a semiconductor device including a plurality of multi-bit memory cells, a first temperature budget sensor, and a circuit. Each of the plurality of multi-bit memory cells is programmable into each of more than two states. The circuit compares a first signal from the first temperature budget sensor to a first reference signal to obtain a first comparison result. The circuit refreshes the plurality of multi-bit memory cells based on the first comparison result.

35 Claims, 7 Drawing Sheets

SEMICONDUCTOR DEVICE INCLUDING MULTI-BIT MEMORY CELLS AND A TEMPERATURE BUDGET SENSOR

CROSS-REFERENCE TO RELATED APPLICATIONS

This Utility Patent Application is related to U.S. patent application Ser. No. 11/436,358, filed on May 18, 2006, entitled "PHASE CHANGE MEMORY HAVING TEMPERATURE BUDGET SENSOR," which is incorporated herein by reference.

BACKGROUND

One type of non-volatile memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse.

One type of resistive memory is phase change memory. Phase change memory uses a phase change material in the resistive memory element. The phase change material exhibits at least two different states. These states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state refers to the state having the higher resistivity and the crystalline state refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two sates. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence cell resistance is controlled via a suitable write strategy. For simplicity, the description in this disclosure is substantially focused on four different resistance levels or states and two bits of data per cell. This is for illustrative purposes only, however, and not intended to limit the scope of the invention. In principle it is possible to store three or more states.

The data retention performance of a phase change memory depends strongly upon the temperature history of the memory. Typically, for nonvolatile memory, data retention is guaranteed for more than ten years at operating temperatures up to 85° C. Data retention is mainly a material property and depends on the crystallization temperature of the phase change material. For example, for $Ge_2Sb_2Te_5$, the data retention performance is about ten years at operating temperatures up to 105° C. to 110° C. However, for many applications this temperature specification is not sufficient. For example, in automotive applications this temperature specification may be exceeded. Also, a memory device is not usually operated at a constant ambient temperature, but rather experiences significant changes in the ambient temperature. For example, a memory device for an engine controller of a car experiences extremes in temperatures based on whether the engine is running. In this case, data retention of the memory device is not so strongly impacted by momentary temperatures (within certain limits) or an average temperature, but rather by the temperature budget accumulated by the memory device. In addition, data retention is more critical in multi-bit phase change memory cells than in single bit phase change memory cells.

For these and other reasons, there is a need for the present invention.

SUMMARY

The present invention provides a semiconductor device having multi-bit memory cells and a temperature budget sensor and a method for monitoring the temperature budget of a device. One embodiment provides a semiconductor device including a plurality of multi-bit memory cells, a first temperature budget sensor, and a circuit. Each of the plurality of multi-bit memory cells is programmable into each of more than two states. The circuit compares a first signal from the first temperature budget sensor to a first reference signal to obtain a first comparison result. The circuit refreshes the plurality of multi-bit memory cells based on the first comparison result.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
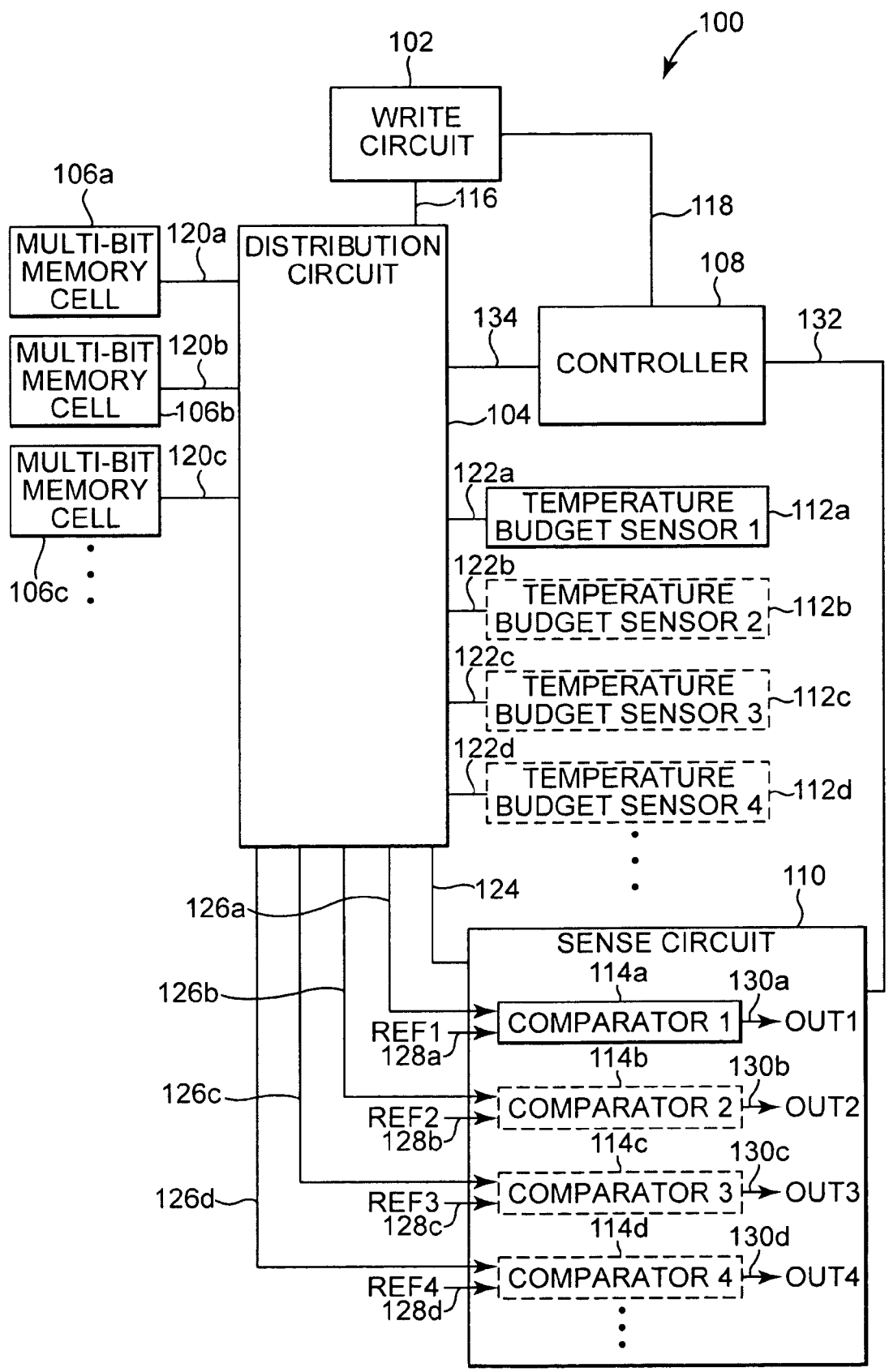
FIG. 1 is a block diagram illustrating one embodiment of a memory device.

FIG. 1 is a block diagram illustrating one embodiment of a memory device 100. Memory device 100 includes a write circuit 102, a distribution circuit 104, multi-bit memory cells 106a, 106b, and 106c, a controller 108, a sense circuit 110, and one or more temperature budget sensors 112a, 112b, 112c, and 112d. Sense circuit 110 includes one or more comparators 114a, 114b, 114c, and 114d. Multi-bit memory cells 106a-106c, also referred to as multilevel memory cells, are phase change memory cells that store data based on the amorphous and crystalline states of phase change material in the multi-bit memory cells. In other embodiments, multi-bit memory cells 106a-106c can be any suitable type of resistive memory cells.

Each of the multi-bit memory cells 106a-106c can be written or programmed into one of more than two states by programming the phase change material to have intermediate resistance values. To program one of the multi-bit memory cells 106a-106c to an intermediate resistance value, the amount of crystalline material coexisting with amorphous material and hence the cell resistance is controlled via controller 108 and a suitable write strategy. In one embodiment, each of the multi-bit memory cells 106a-106c can be programmed into any one of three states. In one embodiment, each of the multi-bit memory cells 106a-106c can be programmed into any one of four states. In other embodiments, each of the multi-bit memory cells 106a-106c can be programmed into any one of any suitable number of states.

Memory device 100 includes one or more of the temperature budget sensors 112a-112d to enable memory device 100 to be operated at temperatures beyond the limits of long term data retention in the phase change material used. Temperature budget sensors 112a-112d monitor the temperature budget of memory device 100 with memory device 100 powered on and operating and with memory device 100 powered off. A simple thermometer would be insufficient for monitoring the temperature budget of memory device 100 since a thermometer would only be active with memory device 100 powered on.

The temperature budget (TB) relevant for data retention in a phase change memory is defined as follows:

$$TB = \int \alpha(T)T(t)dt \qquad \text{Equation 1}$$

Where:

$\alpha(T)$ = sensitivity factor;

$T$ = temperature; and $t$ = time.

Once the temperature budget (TB) of memory device 100 exceeds a maximum allowed threshold value, the data stored in multi-bit memory cells 106a-106c is jeopardized. If the temperature budget of memory device 100 is exceeded or close to being exceeded, data stored in multi-bit memory cells 106a-106c are refreshed to maintain their values. The threshold value can be adjusted to accommodate the most critical multi-bit memory cell(s), such that data retention can be guaranteed for the whole memory device 100.

The sensitivity factor $\alpha(T)$ is different for each of the more than two states of multi-bit memory cells 106a-106c and the sensitivity factor $\alpha(T)$ scales to approximately the inverse of the retention time ($t_{ret}^{-1}$). In addition, data retention in multi-bit memory cells 106a-106c depends not only on the exposed temperature budget but also the cycling age of the multi-bit memory cells 106a-106c. A forced refresh based on the accumulated thermal stress resolves this difficulty.

In one embodiment, temperature budget sensors, such as temperature budget sensors 112a-112d, monitor each state of the more than two states that can be programmed into each of the multi-bit memory cells 106a-106c. In one embodiment, temperature budget sensors, such as temperature budget sensors 112a-112d, monitor each state of the more than two states that are non-crystalline states or at least partially amorphous states of the phase change material in multi-bit memory cells 106a-106c. In one embodiment, memory device 100 includes one temperature budget sensor 112a that monitors one state of the more than two states. In one embodiment, memory device 100 includes one temperature budget sensor 112a that monitors one state of the more than two states, where the monitored state has the largest sensitivity factor $\alpha(T)$ and the shortest retention time. In other embodiments, temperature budget sensors, such as temperature budget sensors 112a-112d, monitor any suitable state or states of multi-bit memory cells 106a-106c.

As used herein, the term "electrically coupled" is not meant to mean that the elements must be directly coupled together and intervening elements may be provided between the "electrically coupled" elements.

Write circuit 102 is electrically coupled to distribution circuit 104 via signal path 116 and to controller 108 via signal path 118. Controller 108 is electrically coupled to distribution circuit 104 via signal path 134. Distribution circuit 104 is electrically coupled to each of the multi-bit memory cells 106a-106c via signal paths 120a-120c. Distribution circuit 104 is electrically coupled to multi-bit memory cell 106a via signal path 120a. Distribution circuit 104 is electrically coupled to multi-bit memory cell 106b via signal path 120b and distribution circuit 104 is electrically coupled to multi-bit memory cell 106c via signal path 120c. In one embodiment, multi-bit memory cells 106a-106c are multi-bit memory cells in an array of multi-bit memory cells, where the array of multi-bit memory cells includes any suitable number of multi-bit memory cells.

Distribution circuit 104 is also electrically coupled to temperature budget sensors 112a-112d via signal paths 122a-122d. Distribution circuit 104 is electrically coupled to temperature budget sensor 1 at 112a via signal path 122a. Distribution circuit 104 is electrically coupled to temperature budget sensor 2 at 112b via signal path 122b. Distribution circuit 104 is electrically coupled to temperature budget sensor 3 at 112c via signal path 122c and distribution circuit 104 is electrically coupled to temperature budget sensor 4 at 112d via signal path 122d.

In addition, distribution circuit 104 is electrically coupled to sense circuit 110 via signal path 124 and to comparators 114a-114d via signal paths 126a-126d. Distribution circuit 104 is electrically coupled to a first input of comparator 1 at 114a via signal path 126a. A second input of comparator 1 at 114a receives a first reference signal (REF1) via reference signal path 128a. The output of comparator 1 at 114a provides a first output signal (OUT1) on output signal path 130a. Distribution circuit 104 is electrically coupled to a first input of comparator 2 at 114b via signal path 126b. A second input of comparator 2 at 114b receives a second reference signal (REF2) via reference signal path 128b. The output of comparator 2 at 114b provides a second output signal (OUT2) on output signal path 130b. Distribution circuit 104 is electrically coupled to a first input of comparator 3 at 114c via signal path 126c. A second input of comparator 3 at 114c receives a third reference signal (REF3) via reference signal path 128c. The output of comparator 3 at 114c provides a third output signal (OUT3) on output signal path 130c. Distribution circuit 104 is electrically coupled to a first input of comparator 4 at 114d via signal path 126d. A second input of comparator 4 at 114d receives a fourth reference signal (REF4) via reference signal path 128d. The output of comparator 4 at 114d provides a fourth output signal (OUT4) on output signal path 130d. Sense circuit 110 is electrically coupled to controller 108 via signal path 132. In one embodiment, sense circuit 110 includes one comparator, such as comparator 1 at 114a, which includes a first input that can be switched to each of the signal paths 126a-126d and a second input that can be switched to each of the corresponding reference signal paths 128a-128d. In other embodiments, sense circuit 110 includes any suitable number of comparators that can be switched to couple with any suitable signal paths 126a-126d and any suitable corresponding reference signal paths 128a-128d. Each of the multi-bit memory cells 106a-106c includes a phase change material that may be changed from an amorphous state to a crystalline state or from a crystalline state to an amorphous state under the influence of temperature change. The amount of crystalline phase change material coexisting with amorphous phase change material in one of the multi-bit memory cells 106a-106c thereby defines the more than two states for storing data within the memory cell and memory device 100.

In the amorphous state, a phase change material exhibits significantly higher resistivity than in the crystalline state. Therefore, by controlling the amorphous and crystalline fractions of the phase change material, the more than two states of multi-bit memory cells 106a-106c differ in their electrical resistivity. In one embodiment, the more than two states include three states and a trinary system is used, where the three states are assigned bit values of "0", "1", and "2". In another embodiment, the more than two states are four states that are assigned bit values such as "00", "01", "10", and "11". In other embodiments, the more than two states can be any suitable number of states in the phase change material of a memory cell.

The phase change material of multi-bit memory cells 106a-106c may be made up of a variety of materials in accordance with the present invention. Generally, chalcogenide alloys that contain one or more elements from group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each of the temperature budget sensors 112a-112d in memory device 100 is written or programmed to an initial state and monitors the total temperature budget of memory device 100. Once the temperature budget of memory device 100 exceeds a specified threshold value, multi-bit memory cells 106a-106c within memory device 100 are refreshed. At the same time multi-bit memory cells 106a-106c are refreshed, each of the temperature budget sensors 112a-112d is reprogrammed to its initial state. The state of each temperature budget sensor 112a-112d is sensed periodically. For example, the state of each temperature budget sensor 112a-112d can be sensed at every power up, once a day, once an hour, once a minute, combinations thereof, or at any other suitable interval. The interval selected is based on the application and the expected temperatures to which memory device 100 will be exposed.

Each of the temperature budget sensors 112a-112d includes a phase change memory cell. In one embodiment, the phase change memory cells for temperature budget sensors 112a-112d are fabricated with multi-bit memory cells 106a-106c. In another embodiment, the phase change memory cells for temperature budget sensors 112a-112d are fabricated separately from multi-bit memory cells 106a-106c, but fabricated using similar processes as used to fabricate multi-bit memory cells 106a-106c.

The phase change memory cell of each of the temperature budget sensors 112a-112d is written to substantially one of the more than two states of the phase change memory cell to initialize the temperature budget sensor 112a-112d. In the non-crystalline states, referred to as the amorphous state and the partially amorphous states, the resistance state is prone to temperature induced crystallization and therefore resistance loss. Also, in the partially amorphous states the resistance state is particularly prone to temperature induced crystallization and resistance loss, since the phase change material in these resistance states consist of an amorphous matrix with lots of crystalline seeds. Hence, the resistance is guaranteed to be reduced faster than the resistance of a fully amorphous state memory cell when exposed to higher temperatures.

In one embodiment, the phase change memory cell of each of the temperature budget sensors 112a-112d is specifically written to a lower resistance end of one of the non-crystalline states of the phase change memory cell to initialize the temperature budget sensor 112a-112d. In one embodiment, for enhanced sensitivity the phase change memory cell of each of the temperature budget sensors 112a-112d is written to a resistance value below the lower resistance end of the non-crystalline states of the phase change memory cell to initialize the temperature budget sensor 112a-112d. In one embodiment, the phase change memory cell of each of the temperature budget sensors 112a-112d is written to a typical resistance for a given state of the phase change memory cell to initialize the temperature budget sensor 112a-112d.

In one embodiment, memory device 100 includes only temperature budget sensor 112a, which is programmed to a lower resistance end of one of the non-crystalline states of the phase change memory cell to initialize the temperature budget sensor 112a-112d. In one embodiment, memory device 100 includes only temperature budget sensor 112a, which is programmed to a resistance value below the lower resistance end of one of the non-crystalline states of the phase change memory cell to initialize the temperature budget sensor 112a-112d. In one embodiment, memory device 100 includes only temperature budget sensor 112a, which is programmed to a lower resistance end of the resistance state having the largest sensitivity factor to initialize the temperature budget sensor 112a-112d. In one embodiment, memory device 100 includes only temperature budget sensor 112a, which is programmed to below the lower resistance end of the resistance state having the largest sensitivity factor to initialize the temperature budget sensor 112a-112d.

Operation of each of the temperature budget sensors 112a-112d is guaranteed even without power to memory device 100, since temperature budget sensors 112a-112d passively record the accumulated crystallization. At the next power up of memory device 100, each of the temperature budget sensors 112a-112d can be read to determine whether multi-bit memory cells 106a-106c should be refreshed.

Controller 108 controls the operation of write circuit 102 and sense circuit 110. Controller 108 includes a microprocessor, microcontroller, or other suitable logic circuitry for controlling the operation of write circuit 102 and sense circuit 110. Controller 108 controls write circuit 102 for programming the resistance states of multi-bit memory cells 106a-106c. Controller 108 controls sense circuit 110 for reading the resistance states of multi-bit memory cells 106a-106c. Controller 108 also controls write circuit 102 for programming the resistance of each of the temperature budget sensors 112a-112d and controller 108 controls sense circuit 110 for reading the resistance of each of the temperature budget sensors 112a-112d. Based on the resistance of the temperature budget sensors 112a-112d, controller 108 refreshes multi-bit memory cells 106a-106c.

Write circuit 102 provides pulses to multi-bit memory cells 106a-106c and programs the resistance levels or states into the phase change material of each of the multi-bit memory cells 106a-106c. In one embodiment, write circuit 102 provides voltage pulses to distribution circuit 104 through signal path 116 and distribution circuit 104 controllably directs the voltage pulses to multi-bit memory cells 106a-106c through signal paths 120a-120c. In one embodiment, distribution circuit 104 includes a plurality of transistors that controllably direct voltage pulses to each of the multi-bit memory cells 106a-106c. In other embodiments, write circuit 102 provides current pulses to distribution circuit 104 through signal path 116 and distribution circuit 104 controllably directs the current pulses to multi-bit memory cells 106a-106c through signal paths 120a-120c.

Write circuit 102 also provides pulses to each of the temperature budget sensors 112a-112d to program initial resistance states. In one embodiment, write circuit 102 provides voltage pulses to distribution circuit 104 through signal path 116 and distribution circuit 104 controllably directs the voltage pulses to temperature budget sensors 112a-112d through signal paths 122a-122d. In one embodiment, distribution circuit 104 includes a plurality of transistors that controllably direct voltage pulses to temperatures budget sensors 112a-112d. In other embodiments, write circuit 102 provides current pulses to distribution circuit 104 through signal path 116 and distribution circuit 104 controllably directs the current pulses to temperature budget sensors 112a-112d through signal paths 122a-122d.

To program a phase change memory cell of one of the multi-bit memory cells 106a-106d or one of the temperature budget sensors 112a-112d within memory device 100, write circuit 102 generates a current or voltage pulse for heating the phase-change material in the target phase change memory cell. In one embodiment, write circuit 102 generates an appropriate current or voltage pulse, which is fed into distribution circuit 104 and distributed to the appropriate target cell. The current or voltage pulse amplitude and duration are controlled by controller 108 depending on the specific state to which the target cell is being programmed. Generally, a "set" operation of a memory cell is heating the phase-change material of the target cell above its crystallization temperature (but below its melting temperature) long enough to achieve the crystalline state or a partially crystalline and partially amorphous state. Generally, a "reset" operation of a memory cell is heating the phase-change material of the target cell above its melting temperature, and then quickly quench cooling the material, thereby achieving the amorphous state or a partially amorphous and partially crystalline state. A memory cell can be programmed to a resistance state between an amorphous state and a crystalline state by applying a partial "set" or a partial "reset" pulse to the memory cell to provide amorphous and crystalline fractions of the phase change material.

Sense circuit 110 senses the resistance of phase change material and provides signals that indicate the resistive state of the phase change material in multi-bit memory cells 106a-106c. Sense circuit 110 reads the states of multi-bit memory cells 106a-106c through signal path 124. Distribution circuit 104 controllably directs read signals between sense circuit 110 and multi-bit memory cells 106a-106c via signal paths 120a-120c. In one embodiment, distribution circuit 104 includes a plurality of transistors that controllably direct read signals between sense circuit 110 and multi-bit memory cells 106a-106c.

Sense circuit 110 senses the resistance of each of the temperature budget sensors 112a-112d and provides signals that indicate the resistive state of the phase change material in each of the temperature budget sensors 112a-112d. Distribution circuit 104 controllably directs read signals between sense circuit 110 and temperature budget sensors 112a-112d via signal paths 122a-122d. Also, distribution circuit 104 controllably directs signals from temperature budget sensors 112a-112d to signal paths 126a-126d, respectively. In one embodiment, sense circuit 110 reads the temperature budget sensors 112a-112d via signal paths 126a-126d and signal paths 122a-122d. In one embodiment, distribution circuit 104 includes a plurality of transistors that controllably direct the read signals between sense circuit 110 and temperature budget sensors 112a-112d.

Sense circuit 110 can read each of the more than two states of the phase change material in each of the multi-bit memory cells 106a-106c and each of the temperature budget sensors 112*a*-112*d*. In one embodiment, to read the resistance of the phase change material, sense circuit 110 provides current that flows through the phase change material of a selected cell and sense circuit 110 reads the voltage across the selected cell. In one embodiment, sense circuit 110 provides voltage across the phase change material of a selected cell and sense circuit 110 reads the current that flows through the selected cell. In one embodiment, write circuit 102 provides voltage across the selected cell and sense circuit 110 reads the current that flows through the selected cell. In one embodiment, write circuit 102 provides current through the selected cell and sense circuit 110 reads the voltage across the selected cell.

Comparators 114*a*-114*d* compare resistance values of temperature budget sensors 112*a*-112*d* to reference signals REF1-REF4. Reference signal REF1 at 128*a* corresponds to temperature budget sensor 1 at 112*a*. Reference signal REF2 at 128*b* corresponds to temperature budget sensor 2 at 112*b*. Reference signal REF3 at 128*c* corresponds to temperature budget sensor 3 at 112*c* and reference signal REF4 at 128*d* corresponds to temperature budget sensor 4 at 112*d*.

Comparator 114*a* receives a read signal from temperature budget sensor 1 at 112*a* via distribution circuit 104 and signal path 126*a* and comparator 114*a* receives reference signal REF1 via signal path 128*a*. Comparator 114*a* provides a comparison result in output signal OUT1 via signal path 130*a*. Comparator 114*b* receives a read signal from temperature budget sensor 2 at 112*b* via distribution circuit 104 and signal path 126*b* and comparator 114*b* receives reference signal REF2 via signal path 128*b*. Comparator 114*b* provides a comparison result in output signal OUT2 via signal path 130*b*. Comparator 114*c* receives a read signal from temperature budget sensor 3 at 112*c* via distribution circuit 104 and signal path 126*c* and reference signal REF3 via signal path 128*c*. Comparator 114*c* provides a comparison result in output signal OUT3 via signal path 130*c*. Comparator 114*d* receives a read signal from temperature budget sensor 4 at 112*d* via distribution circuit 104 and signal path 126*d* and reference signal REF4 via signal path 128*d*. Comparator 114*d* provides a comparison result in output signal OUT4 via signal path 130*d*.

In one embodiment, each of the reference signals REF1-REF4 is selected such that a voltage applied across the corresponding temperature budget sensor 112*a*-112*d* generates a current read signal greater than the reference signal to indicate that the multi-bit memory cells 106*a*-106*c* should be refreshed. In another embodiment, each of the reference signals REF1-REF4 is selected such that a current applied to the corresponding temperature budget sensor 112*a*-112*d* generates a voltage read signal less than the reference signal to indicate that the multi-bit memory cells 106*a*-106*c* should be refreshed. In one embodiment, each of the reference signals REF1-REF4 is adjusted based on a current temperature of memory device 100 using a band gap reference or other suitable circuit.

In one embodiment, read signals on signal paths 126*a*-126*d* are current signals providing indications of the resistance states of temperature budget sensors 112*a*-112*d* and reference signals REF1-REF4 on signal paths 128*a*-128*d* are current signals. In another embodiment, read signals on signal paths 126*a*-126*d* are voltage signals providing indications of the resistance states of temperature budget sensors 112*a*-112*d* and reference signals REF1-REF4 on signal paths 128*a*-128*d* are voltage signals.

In any case, in response to a resistance value from one of the temperature budget sensors 112*a*-112*d* being less than a reference resistance value indicated by the corresponding reference signal RAF1-REF4, the corresponding comparator 114*a*-114*d* outputs a logic high output signal OUT1-OUT4. In response to the resistance value from one of the temperature budget sensors 112*a*-112*d* being greater than the reference resistance value indicated by the corresponding reference signal RAF1-REF4, the corresponding comparator 114*a*-114*d* outputs a logic low output signal OUT1-OUT4.

Controller 108 controls write circuit 102 to refresh multi-bit memory cells 106*a*-106*c* in response to one or more logic high outputs in output signals OUT1-OUT4. In response to all logic low outputs in output signals OUT1-OUT4, controller 108 does not refresh multi-bit memory cells 106*a*-106*c* and normal operations continue. Sense circuit 110 periodically senses the state of temperature budget sensors 112*a*-112*d* and controller 108 refreshes multi-bit memory cells 106*a*-106*c* in response to one or more logic high outputs in output signals OUT1-OUT4.

Figure 2:
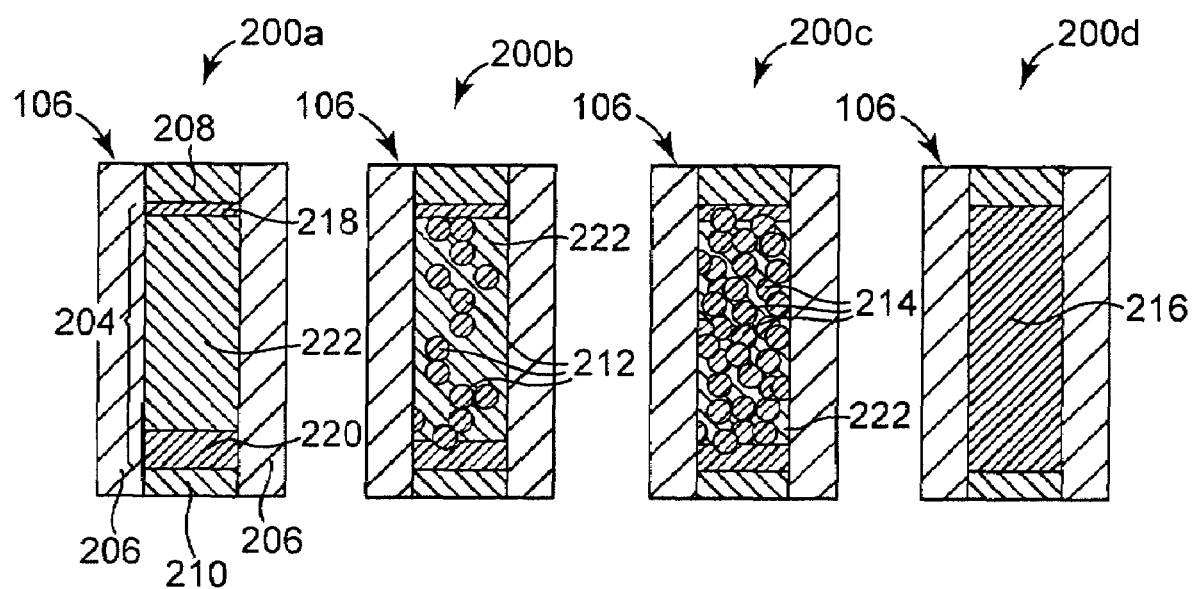
FIG. 2 is a diagram illustrating one embodiment of a multi-bit or multi-level phase change memory cell in four different states.

FIG. 2 is a diagram illustrating one embodiment of a multi-bit or multilevel phase change memory cell 106 in four different states at 200*a*, 200*b*, 200*c*, and 200*d*. Phase change memory cell 106 includes a phase change material 204 that is laterally surrounded by insulation material 206. Phase change memory cell 106 can have any suitable geometry including phase change material 204 in any suitable geometry and insulation material 206 in any suitable geometry.

Phase change material 204 is electrically coupled at one end to a first electrode 208 and at the other end to a second electrode 210. Pulses are provided to phase change memory cell 106 via first electrode 208 and second electrode 210. The current path through phase change material 204 is from one of the first electrode 208 and second electrode 210 to the other one of the first electrode 208 and second electrode 210. Phase change memory cell 106 provides a storage location for storing bits of data.

Insulation material 206 can be any suitable insulator, such as $SiO_2$, SiOx, SiN, fluorinated silica glass (FSG), or borophosphorous silicate glass (BPSG). First electrode 208 and second electrode 210 can be any suitable electrode material, such as TiN, TiSiN, TiAlN, TaN, TaSiN, TaAlN, W, WN, Al, or Cu.

Phase change material 204 is programmed into one of four states to store two bits of data. A write circuit, such as write circuit 102, is coupled to first electrode 208 to provide pulses to phase change material 204. The pulses reset phase change material 204 or program one of the other three states into phase change material 204. At 200*b*, a small fraction 212 of phase change material 204 has been programmed to change the resistance through phase change into the crystalline state. At 200*c*, a medium sized fraction 214 of phase change material 204 has been programmed to change the resistance through phase change into the crystalline state. At 200*d*, a large fraction 216, which is substantially all of phase change material 204, has been programmed to change the resistance through phase change into the crystalline state.

The size of the programmed fraction is related to the resistance through phase change material 204 and phase change memory cell 106. The three different phase change fractions at 200*b*-200*d* plus the initial state at 200*a* provide four states in phase change material 204, and phase change memory cell 106 provides a storage location for storing two bits of data. In one embodiment, the state of phase change memory cell 106 at 200*a* is a "00", the state of phase change memory cell 106 at 200*b* is a "01", the state of phase change memory cell 106 at 200*c* is a "10", and the state of phase change memory cell 106 at 200*d* is a "11". In another embodiment, the state of phase change memory cell 106 at 200*a* is a "11", the state of phase change memory cell 106 at 200*b* is a "10", the state of phase change memory cell 106 at 200c is a "01", and the state of phase change memory cell 106 at 200d is a "00".

At 200a, phase change material 204 is reset to a substantially amorphous state. During a reset operation of phase change memory cell 106, a reset current pulse is provided via the write circuit 102 through first electrode 208 and phase change material 204. The reset current pulse heats phase change material 204 above its melting temperature and phase change material 204 is quickly cooled to achieve the substantially amorphous state at 200a. After a reset operation, phase change material 204 includes crystalline state phase change material at 218 and 220, and amorphous state phase change material at 222. The substantially amorphous state at 200a, referred to herein as one of the non-crystalline states, is the highest resistance state of phase change memory cell 106.

To program phase change material 204 into one of the other three states 200b-200d, a set current pulse is provided via write circuit 102 through first electrode 208 and phase change material 204. At 200b, write circuit 102 provides a set current pulse to program the small volume fraction 212 into a crystalline state. The crystalline state is less resistive than the amorphous state and phase change memory cell 106 at 200b has a lower resistance than phase change memory cell 106 in the substantially amorphous state at 200a. The partially crystalline and partially amorphous state at 200b, referred to herein as one of the non-crystalline states, is the second highest resistance state of phase change memory cell 106.

At 200c, write circuit 102 provides a set current pulse to program the medium volume fraction 214 into a crystalline state. Since the crystalline fraction 214 is larger than the crystalline fraction 212 and the crystalline state is less resistive than the amorphous state, phase change memory cell 106 at 200c has a lower resistance than phase change memory cell 106 at 200b and phase change memory cell 106 in the amorphous state at 200a. The partially crystalline and partially amorphous state at 200c, referred to herein as one of the non-crystalline states, is the second lowest resistance state of phase change memory cell 106.

At 200d, write circuit 102 provides a set current pulse to program substantially all of the phase change material 216 into the crystalline state. Since the crystalline state is less resistive than the amorphous state, phase change memory cell 106 at 200d has a lower resistance than phase change memory cell 106 at 200c, phase change memory cell 106 at 200b, and phase change memory cell 106 in the amorphous state at 200a. The substantially crystalline state at 200d is the lowest resistance state of phase change memory cell 106. In other embodiments, phase change memory cell 106 can be programmed into any suitable number of resistance values or states. In other embodiments, phase change memory cell 106 can be set to a substantially crystalline state and reset pulses can be used to program phase change memory cell 106 to the desired resistance value or state.

Figure 3:
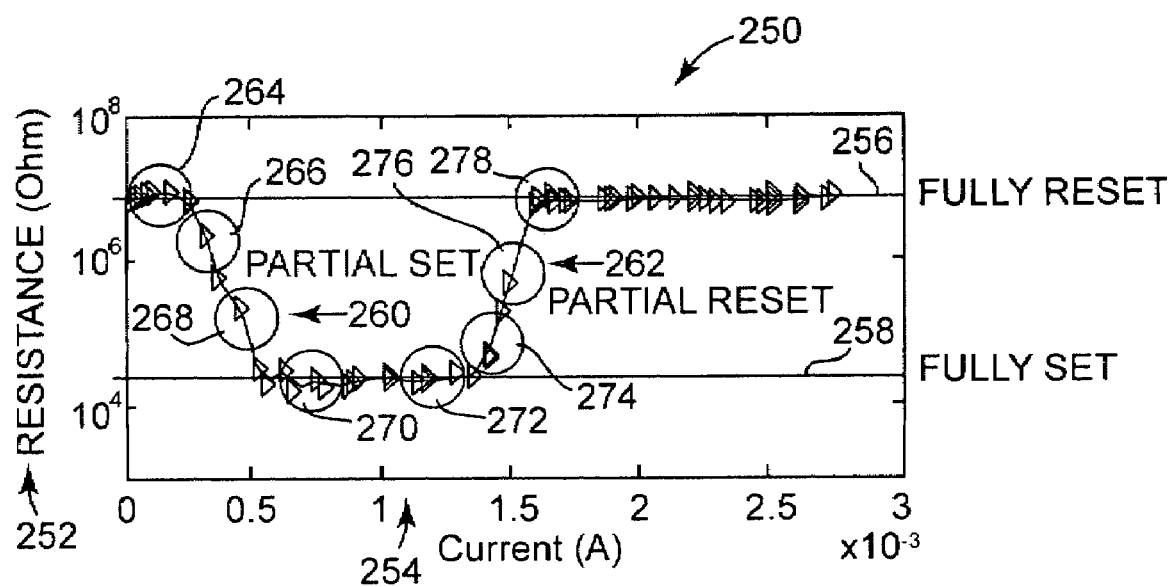
FIG. 3 is a graph illustrating one embodiment of setting the resistance states of a phase change memory cell.

FIG. 3 is a graph 250 illustrating one embodiment of setting the resistance states of a phase change memory cell 106. Graph 250 includes the current in Amps (A) applied to the phase change memory cell on x-axis 254 versus the resistance in Ohms of the phase change memory cell on y-axis 252 after applying the specified current. Starting from a fully reset phase change memory cell as indicated at 256, a current between approximately 0 A and $0.3 \times 10^{-3}$ A does not change the resistance state of the phase change memory cell from the fully reset state. A current between approximately $0.3 \times 10^{-3}$ A and $0.5 \times 10^{-3}$ A changes the resistance state of the phase change memory cell to a partially set state as indicated at 260. A current between approximately $0.5 \times 10^{-3}$ A and $1.4 \times 10^{-3}$ A changes the resistance state of the phase change memory cell to a fully set state as indicated at 258. A current between approximately $1.4 \times 10^{-3}$ A and $1.6 \times 10^{-3}$ A changes the resistance state of the phase change memory cell to a partially reset state as indicated at 262. A current greater than approximately $1.6 \times 10^{-3}$ A changes the resistance state of the phase change memory cell back to the fully reset state as indicated at 256. The specific current ranges for obtaining the partially set, fully set, partially reset, and fully reset states vary based on the phase change material used, the memory cell concept used, and the memory cell dimensions used.

Starting from the fully reset state as indicated at 256, a phase change memory cell 106 can be programmed to one of four resistance states by controlling the current. If no current is applied, the phase change memory cell remains in the fully reset state. If a small current is applied, the phase change memory cell is programmed to a first state as indicated at 264. This state is illustrated at 200a in FIG. 2. In one embodiment, this state is a "11" state. If additional current is applied beyond the first state, the phase change memory cell is programmed to a second state as indicated at 266. This state is illustrated at 200b in FIG. 2. In one embodiment, this state is a "10" state. If additional current is applied beyond the second state, the phase change memory cell is programmed to a third state as indicated at 268. This state is illustrated at 200c in FIG. 2. In one embodiment, this state is a "01" state. If additional current is applied beyond the third state, the phase change memory cell is programmed to the fully set state as indicated at 270. This state is illustrated at 200d in FIG. 2. In one embodiment, this state is a "00" state.

Starting from the fully set state as indicated at 258, a phase change memory cell can also be programmed to one of four resistance states by controlling the current. For example, if a first current is applied, the phase change memory cell is programmed to a first state as indicated at 272. In one embodiment, this state is a "00" state. If additional current is applied beyond the first state, the phase change memory cell is programmed to a second state as indicated at 274. In one embodiment, this state is a "01" state. If additional current is applied beyond the second state, the phase change memory cell is programmed to a third state as indicated at 276. In one embodiment, this state is a "10" state. If additional current is applied beyond the third state, the phase change memory cell is programmed to the fully reset state as indicated at 278. In one embodiment, this state is a "11" state.

Figure 4:
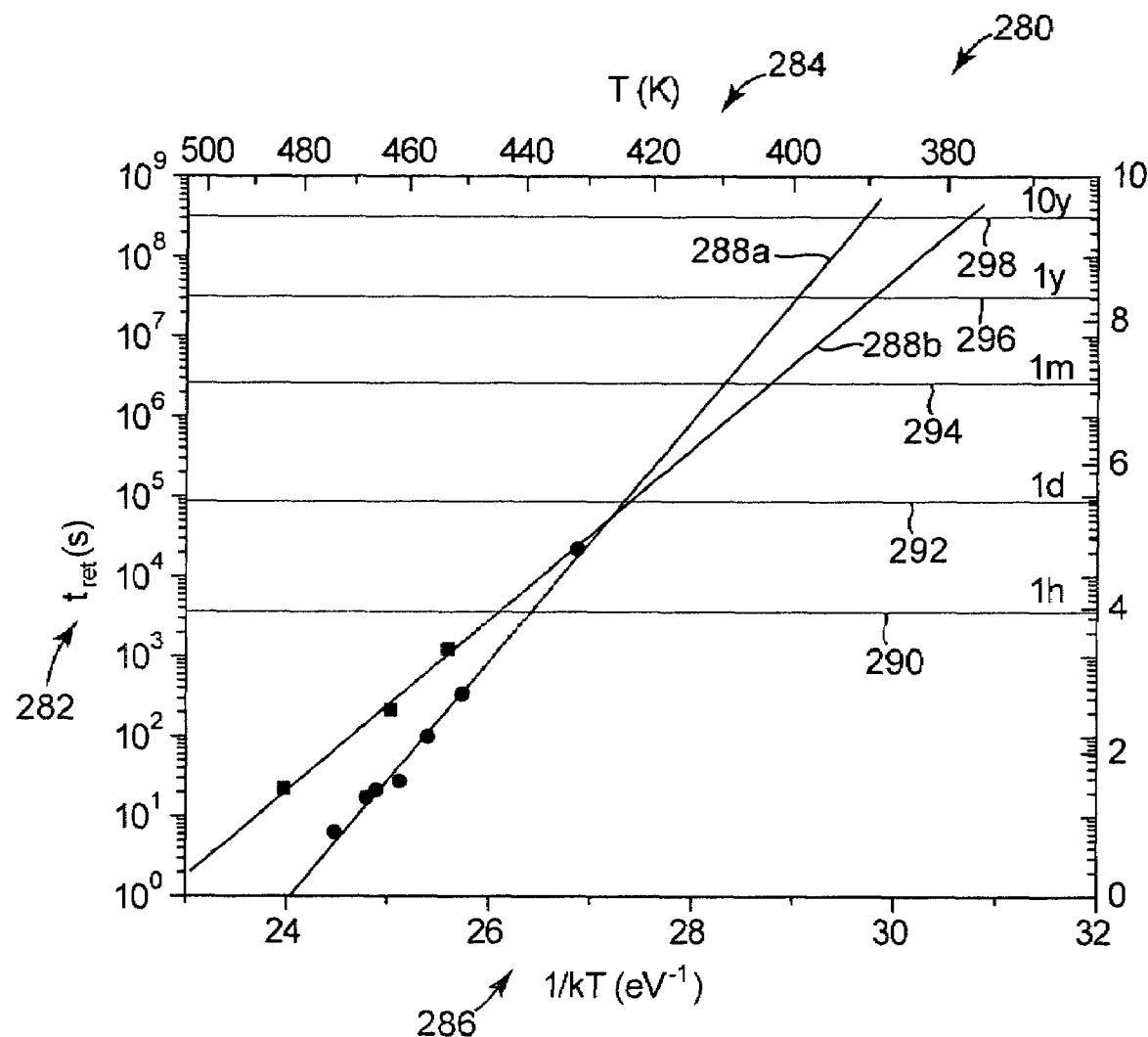
FIG. 4 is a chart illustrating one embodiment of retention time versus temperature for two different experiments.

FIG. 4 is a chart 280 illustrating one embodiment of retention time versus temperature for two different experiments. Chart 280 includes temperature (T) in K on x-axis 284 and in $1/kT$ ($eV^{-1}$) on x-axis 286 and retention time ($t_{ret}$) in seconds on Y-axis 282. Line 288a illustrates the retention time versus temperature for single bit memory cells in a first experiment and line 288b illustrates the retention time versus temperature for single bit memory cells in a second experiment. The data retention time is critical for single bit phase change memory cells and the problem is enhanced for multi-bit phase change memory cells.

As illustrated in chart 280, the specification of 105° C. for 10 year data retention in memory device 100 is indicated at 298. Memory device 100 can be operated at a temperature of approximately 120° C. if memory cells 106a-106c of memory device 100 are refreshed once a year as indicated at 296. Memory device 100 can be operated at a temperature of approximately 130° C. if memory cells 106a-106c of memory device 100 are refreshed once a month as indicated at 294. Memory device 100 can be operated at a temperature of approximately 150° C. if memory cells 106a-106c of memory device 100 are refreshed once a day as indicated at 292. Memory device 100 can be operated at a temperature of approximately 170° C. if memory cells 106a-106c of memory device 100 are refreshed once an hour as indicated at 290. As the refresh period is shortened, the temperature memory device 100 can withstand increases.

Temperature budget sensors 112a-112d sense the accumulated total temperature budget experienced by memory device 100 and memory device 100 is refreshed if the temperature budget is exceeded. Refreshing memory device 100 when the temperature budget is exceeded prevents unnecessary refreshes of memory device 100 at specified intervals, while expanding the temperature range at which memory device 100 can operate.

Embodiments of the present invention include one or more temperature budget sensors in a memory device having multi-bit phase change memory cells. The one or more temperature budget sensors monitor the temperature budget to which the memory device has been exposed. The one or more temperature budget sensors monitor the temperature budget to which the memory device has been exposed with the memory device powered on and powered off. Once a safe level for the temperature budget of the memory device is exceeded, the memory cells of the memory device are refreshed to maintain their values.

Figure 5:
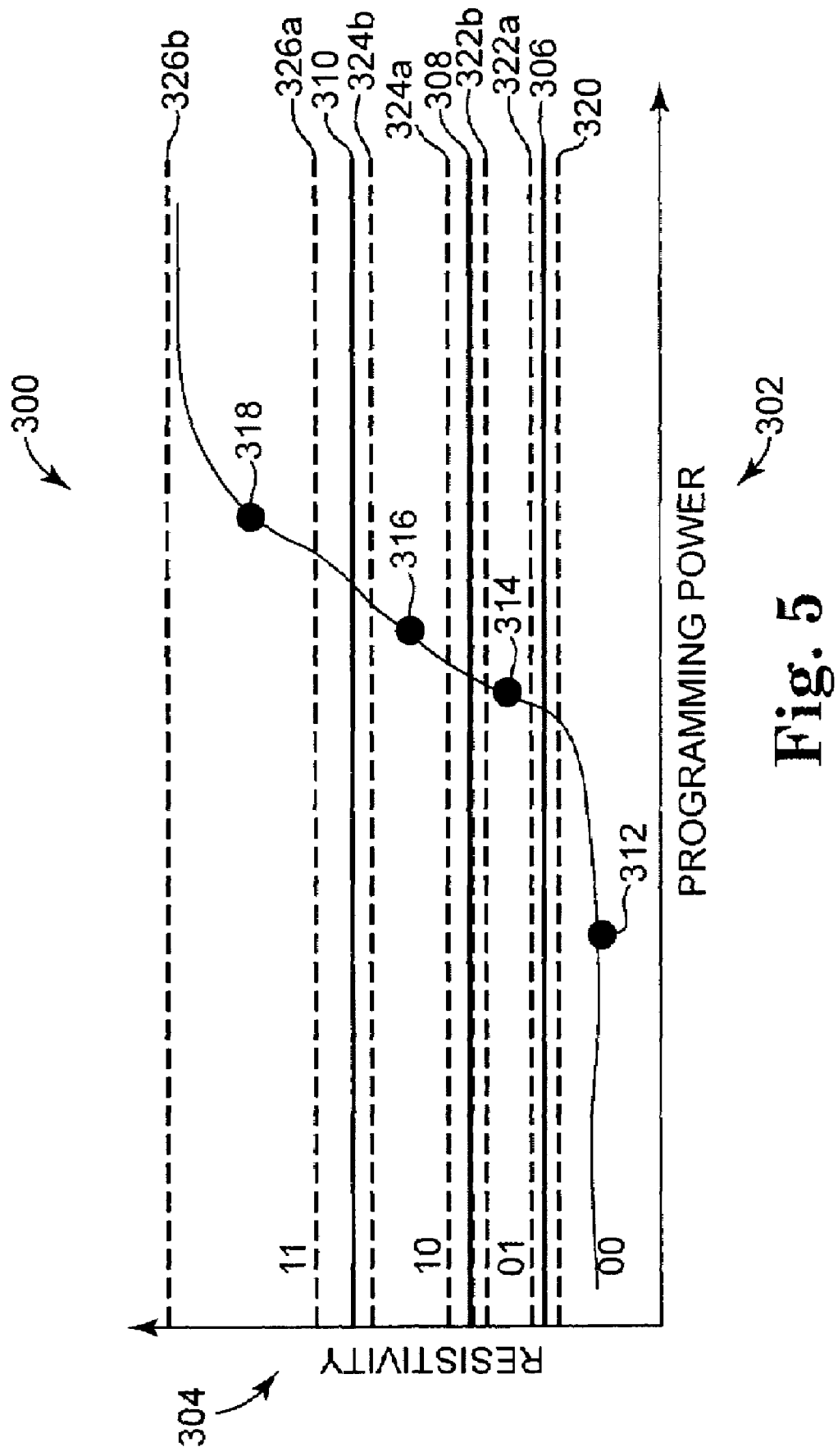
FIG. 5 is a graph illustrating one embodiment of a memory device that includes temperature budget sensors monitoring one or more states of multi-bit phase change memory cells.

FIG. 5 is a graph 300 illustrating one embodiment of memory device 100 that includes temperature budget sensors 112a-112d monitoring one or more states of multi-bit phase change memory cells 106a-106c. Each of the temperature budget sensors 112a-112d is similar to a multi-bit phase change memory cell 106a-106c in memory device 100. Also, each of the multi-bit phase change memory cells 106a-106c and each of the temperature budget sensors 112a-112d is similar to memory cell 106 (shown in FIG. 2). In one embodiment, each of the temperature budget sensors 112a-112d is one of the multi-bit phase change memory cells in an array of multi-bit phase change memory cells that includes multi-bit phase change memory cells 106a-106c in memory device 100.

Graph 300 includes the programming power applied to a phase change memory cell of one of the multi-bit phase change memory cells 106a-106c or one of the temperature budget sensors 112a-112d on x-axis 302 versus the resistivity of the phase change memory cell on y-axis 304 after applying the programming power. Each of the multi-bit phase change memory cells 106a-106c and each of the temperature budget sensors 112a-112d can be programmed into each of four multilevel states. The crystalline state, which is the lowest resistivity state, is indicated at "00". The next higher resistivity state, which includes some phase change material in the amorphous state, is indicated at "01". The next higher resistivity state, which includes more phase change material in the amorphous state, is indicated at "10", and the amorphous state, which is the highest resistivity state, is indicated at "11". The non-crystalline states are the multilevel states indicated at "01", "10", and "11".

Sense circuit 110 includes sense amplifier references for distinguishing each of the four multilevel states. The crystalline state at "00" is identified via sense amplifier reference 306. The next higher resistivity state at "01" is identified via sense amplifier references 306 and 308. The next higher resistivity state at "10" is identified via sense amplifier references 308 and 310. The amorphous state is distinguished via sense amplifier reference 310.

One or more of the temperature budget sensors 112a-112d is programmed into one of the four multilevel states. In one embodiment, each of the temperature budget sensors 112a-112d is programmed into one of the four multilevel states. For example, temperature budget sensor 112a is programmed into the crystalline state at 312, temperature budget sensor 112b is programmed into the next higher state at 314, temperature budget sensor 112c is programmed into the next higher state at 316, and temperature budget sensor 112d is programmed into the amorphous state at 318. In one embodiment, only one of the temperature budget sensors 112a-112d is programmed into one of the four multilevel states. In other embodiments, any suitable number of temperature budget sensors 112a-112d are programmed into one of any suitable number of multilevel states.

Sense circuit 110 includes one or more temperature budget sensor limits for each of the four multilevel states. Temperature budget sensor limit 320 is the resistivity limit for a temperature budget sensor 112a-112d programmed into the crystalline state at "00". Temperature budget sensor limits 322a and 322b are the resistivity limits for a temperature budget sensor 112a-112d programmed into the next higher resistivity state at "01". Temperature budget sensor limits 324a and 324b are the resistivity limits for a temperature budget sensor 112a-112d programmed into the next higher resistivity state at "10". Temperature budget sensor limit 326a and 326b are the resistivity limits for a temperature budget sensor 112a-112d programmed into the amorphous state at "11".

Sense circuit 110 periodically senses the resistivity of each of the temperature budget sensors 112a-112d programmed into one of the four multilevel states. Sense circuit 110 compares the sensed resistivity to the sensor limit or sensor limits for the corresponding multilevel state. If the sensed resistivity is outside the resistivity band for the multilevel state as defined by the sensor limit(s), sense circuit 110 indicates that the temperature budget has been exceeded and controller 108 refreshes multi-bit phase change memory cells 106a-106c via write circuit 102. If the sensed resistivity is inside the resistivity band for the multilevel state as defined by the sensor limit(s), sense circuit 110 indicates that the temperature budget has not been exceeded and controller 108 continues normal operations.

Figure 6:
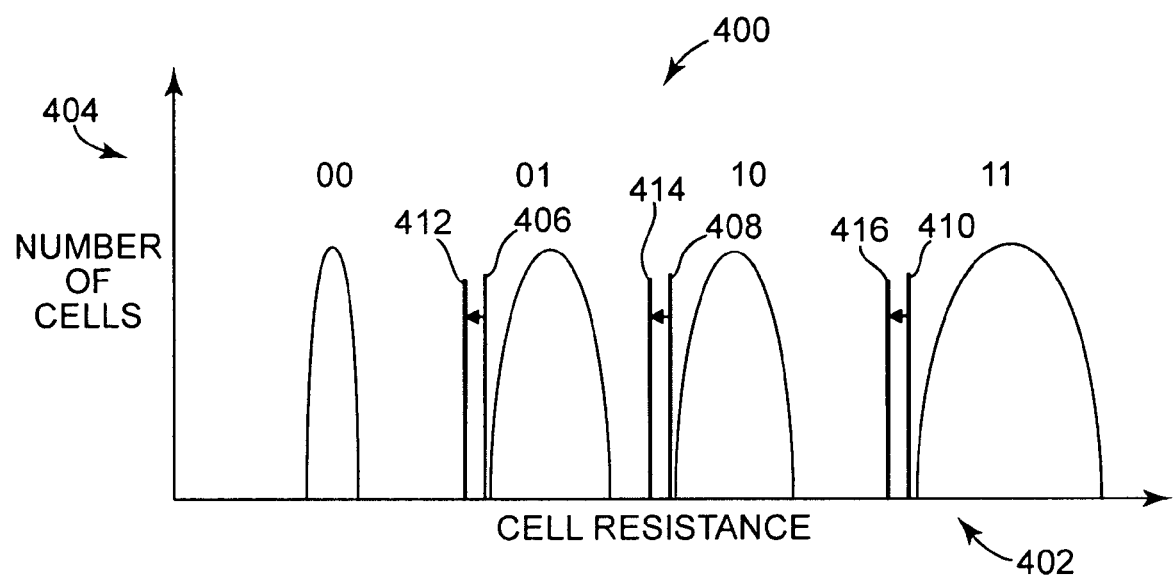
FIG. 6 is a graph illustrating one embodiment of a memory device that includes temperature budget sensors monitoring non-crystalline states of multi-bit phase change memory cells.

FIG. 6 is a graph 400 illustrating one embodiment of memory device 100 that includes temperature budget sensors 112a-112c monitoring non-crystalline states of multi-bit phase change memory cells 106a-106c. In one embodiment, each of the temperature budget sensors 112a-112c is similar to a multi-bit phase change memory cell 106a-106c in memory device 100. In one embodiment, each of the multi-bit phase change memory cells 106a-106c and each of the temperature budget sensors 112a-112c is similar to memory cell 106 (shown in FIG. 2). In one embodiment, each of the temperature budget sensors 112a-112c is one of the multi-bit phase change memory cells in an array of multi-bit phase change memory cells that includes multi-bit phase change memory cells 106a-106c in memory device 100.

Graph 400 includes cell resistance on x-axis 402 versus the number of phase change memory cells on y-axis 404. Each of the multi-bit phase change memory cells 106a-106c and each of the temperature budget sensors 112a-112c can be programmed into each of four multilevel states. The crystalline state, which is the lowest resistivity state, is indicated at "00". The next higher resistivity state, which includes some phase change material in the amorphous state, is indicated at "01". The next higher resistivity state, which includes more phase change material in the amorphous state, is indicated at "10", and the amorphous state, which is the highest resistivity state, is indicated at "11". The non-crystalline states are the multilevel states indicated at "01", "10", and "11".

Each of the temperature budget sensors 112a-112c is programmed to the lower resistance end of one of the three non-crystalline states. For enhanced sensitivity, each of the temperature budget sensors 112a-112c is programmed to a resistance value slightly below the lower resistance end of one of the three non-crystalline states. Programming to the lower resistance end or slightly below the lower resistance end of one of the multilevel states is referred to herein as programming to substantially the lower resistance end of a multilevel state.

Temperature budget sensor 112a is programmed to substantially the lower resistance end of the non-crystalline state "01" at 406, temperature budget sensor 112b is programmed to substantially the lower resistance end of the non-crystalline state "10" at 408, and temperature budget sensor 112c is programmed to substantially the lower resistance end of the non-crystalline state "11" at 410.

Sense circuit 110 includes one temperature budget sensor limit for each of the three non-crystalline states. Temperature budget sensor limit 412 is the resistivity limit for temperature budget sensor 112a, which is programmed to substantially the lower resistance end of the non-crystalline state at "01". Temperature budget sensor limit 414 is the resistivity limit for temperature budget sensor 112b, which is programmed to substantially the lower resistance end of the non-crystalline state at "10". Temperature budget sensor limit 416 is the resistivity limit for temperature budget sensor 112c, which is programmed to substantially the lower resistance end of the non-crystalline state at "11", referred to as the amorphous state.

Sense circuit 110 periodically senses the resistivity of each of the temperature budget sensors 112a-112c and compares the sensed resistivity to the corresponding one of the sensor limits 412, 414, or 416. If the sensed resistivity is below the sensor limit, sense circuit 110 indicates that the temperature budget has been exceeded and controller 108 refreshes multi-bit phase change memory cells 106a-106c via write circuit 102. If the sensed resistivity is above the sensor limit, sense circuit 110 indicates that the temperature budget has not been exceeded and controller 108 continues normal operations.

Figure 7:
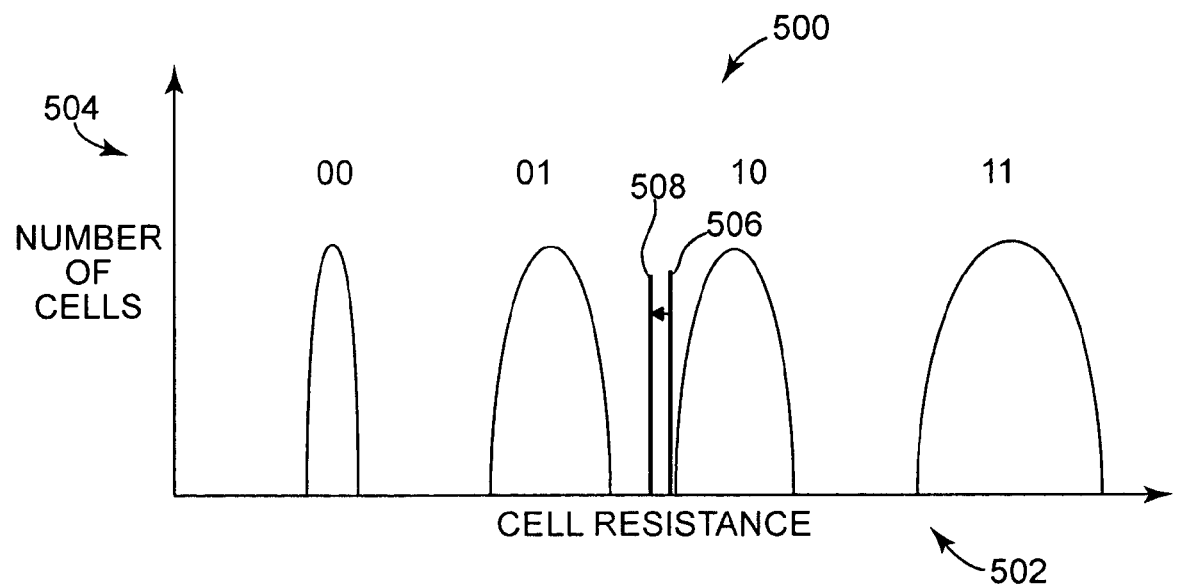
FIG. 7 is a graph illustrating one embodiment of a memory device that includes a temperature budget sensor monitoring one non-crystalline state of multi-bit phase change memory cells.

FIG. 7 is a graph 500 illustrating one embodiment of memory device 100 that includes temperature budget sensor 112a monitoring one non-crystalline state of multi-bit phase change memory cells 106a-106c. Temperature budget sensor 112a monitors one intermediate non-crystalline state (excluding the amorphous state) of multi-bit phase change memory cells 106a-106c. In one embodiment, temperature budget sensor 112a monitors the multilevel state having the largest sensitivity factor and the shortest retention time.

In one embodiment, temperature budget sensor 112a is similar to multi-bit phase change memory cells 106a-106c. In one embodiment, each of the multi-bit phase change memory cells 106a-106c and temperature budget sensor 112a is similar to memory cell 106 (shown in FIG. 2). In one embodiment, temperature budget sensor 112a is one of the multi-bit phase change memory cells in an array of multi-bit phase change memory cells that includes multi-bit phase change memory cells 106a-106c in memory device 100.

Graph 500 includes cell resistance on x-axis 502 versus the number of phase change memory cells on y-axis 504. Each of the multi-bit phase change memory cells 106a-106c and temperature budget sensor 112a can be programmed into each of four multilevel states. The crystalline state, which is the lowest resistivity state, is indicated at "00". The next higher resistivity state, which includes some phase change material in the amorphous state, is indicated at "01". The next higher resistivity state, which includes more phase change material in the amorphous state, is indicated at "10", and the amorphous state, which is the highest resistivity state, is indicated at "11". The non-crystalline states are the multilevel states indicated at "01", "10", and "11". The intermediate non-crystalline states are the multilevel states indicated at "01" and "10".

Temperature budget sensor 112a is programmed to the lower resistance end of one of the non-crystalline states or, for enhanced sensitivity, temperature budget sensor 112a is programmed to a resistance value slightly below the lower resistance end of one of the non-crystalline states. Programming to the lower resistance end or slightly below the lower resistance end of one of the multilevel states is referred to herein as programming to substantially the lower resistance end of a multilevel state. Temperature budget sensor 112a is programmed to substantially the lower resistance end of the non-crystalline state "10" at 506.

Sense circuit 110 includes a temperature budget sensor limit 508, which is the resistivity limit for temperature budget sensor 112a programmed to substantially the lower resistance end of the non-crystalline state at "10". Sense circuit 110 periodically senses the resistivity of temperature budget sensor 112a and compares the sensed resistivity to the corresponding sensor limit 508. If the sensed resistivity is below the sensor limit 508, sense circuit 110 indicates that the temperature budget has been exceeded and controller 108 refreshes multi-bit phase change memory cells 106a-106c via write circuit 102. If the sensed resistivity is above the sensor limit 508, sense circuit 110 indicates that the temperature budget has not been exceeded and controller 108 continues normal operations.

Figure 8:
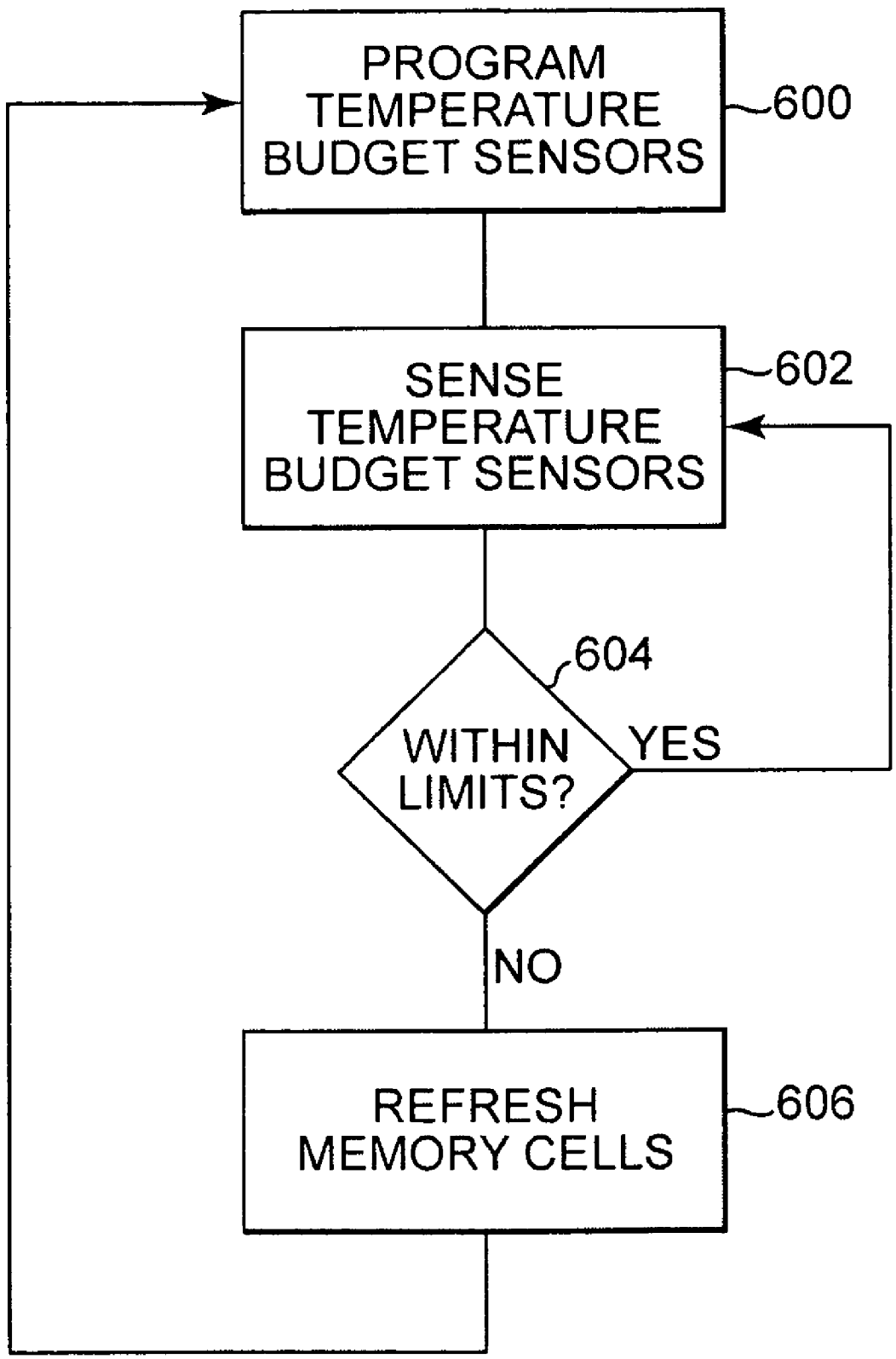
FIG. 8 is a flow chart diagram illustrating the temperature budget sensing operation of a memory device.

FIG. 8 is a flowchart diagram illustrating the temperature budget sensing operation of memory device 100. At 600, controller 108 and write circuit 102 program one or more temperature budget sensors 112a-112d. At 602, controller 108 and sense circuit 110 sense the resistance values of each of the temperature budget sensors 112a-112d. At 604, sense circuit 110 compares the sensed resistance value to one or more temperature budget sensor limits. If the sensed resistivity is outside of, i.e., violates, the sensor limit(s), sense circuit 110 indicates that the temperature budget has been exceeded and at 606 controller 108 refreshes multi-bit phase change memory cells 106a-106c via write circuit 102. Next, the temperature budget sensors 112a-112d are re-programmed at 600 and the process continues. If the sensed resistivity is inside the sensor limit(s), sense circuit 110 indicates that the temperature budget has not been exceeded and controller 108 continues normal operations, periodically sensing the resistance of the temperature budget sensors 112a-112d at 602.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a plurality of multi-bit memory cells, wherein each of the plurality of multi-bit memory cells is programmable into each of more than two states;
a first temperature budget sensor; and
a circuit that compares a first signal from the first temperature budget sensor to a first reference signal to obtain a first comparison result, and refreshes the plurality of multi-bit memory cells based on the first comparison result, wherein the first temperature budget sensor includes a multi-bit memory cell that is programmable into each of more than two states and the first temperature budget sensor is written to one of the more than two states.

2. The semiconductor device of claim 1, wherein the circuit compares the first signal from the first temperature budget sensor to a resistivity band to obtain a temperature budget result.

3. The semiconductor device of claim 1, comprising:
a second temperature budget sensor, wherein the circuit compares a second signal from the second temperature budget sensor to a second reference signal to obtain a second comparison result and refreshes the plurality of multi-bit memory cells based on the second comparison result.

4. The semiconductor device of claim 1, wherein the first temperature budget sensor comprises at least one of the following:
one of the plurality of multi-bit memory cells; and
a resistive multi-bit memory cell.

5. The semiconductor device of claim 1, wherein the plurality of multi-bit memory cells are a plurality of multi-bit phase change memory cells and the first temperature budget sensor comprises a multi-bit phase change memory cell that is programmable into each of more than two states.

6. The semiconductor device of claim 5, wherein the first temperature budget sensor is written to at least one of the following:
one of the more than two states having a larger sensitivity factor than any other state of the more than two states; and
a non-crystalline state of the more than two states.

7. The semiconductor device of claim 5, wherein the first temperature budget sensor is written to at least one of the following:
substantially a lower resistance end of one of the more than two states; and
substantially a lower resistance end of one non-crystalline state of the more than two states.

8. The semiconductor device of claim 5, wherein the first temperature budget sensor is written to substantially a lower resistance end of one of the more than two states having a larger sensitivity factor than any other state of the more than two states.

9. The semiconductor device of claim 1, wherein the plurality of multi-bit memory cells comprises a plurality of multi-bit phase change memory cells, wherein each of the plurality of multi-bit phase change memory cells includes at least one of Ge, Sb, Te, Ga, As, In, Se, and S.

10. A memory comprising:
an array of multi-bit phase change memory cells, wherein each of the multi-bit phase change memory cells includes phase change material programmable into each state of multiple non-crystalline states;
a first temperature budget sensor including the phase change material programmable into each state of the multiple non-crystalline states; and
a circuit that compares a first signal from the first temperature budget sensor to a first reference signal to obtain a first comparison result and refreshes the array of multi-bit phase change memory cells based on the first comparison result.

11. The memory of claim 10, wherein the first temperature budget sensor is written to substantially a lower resistance end of one non-crystalline state having a larger sensitivity factor than other non-crystalline states of the multiple non-crystalline states.

12. The memory of claim 10, wherein the first reference signal is adjusted based on a current temperature of the memory.

13. The memory of claim 10, comprising:
a second temperature budget sensor including the phase change material programmable into each state of the multiple non-crystalline states, wherein the circuit compares a second signal from the second temperature budget sensor to a second reference signal to obtain a second comparison result and refreshes the array of multi-bit phase change memory cells based on the second comparison result, and wherein the first temperature budget sensor is written to substantially a lower resistance end of a first non-crystalline state and the second temperature budget sensor is written to substantially a lower resistance end of a second non-crystalline state of the multiple non-crystalline states.

14. The memory of claim 10, wherein each of the multi-bit phase change memory cells includes at least one of Ge, Sb, Te, Ga, As, In, Se, and S.

15. A semiconductor device, comprising:
a plurality of multi-bit memory cells, wherein each of the plurality of multi-bit memory cells is programmable into each of more than two states;
a first temperature budget sensor that includes a first multi-bit memory cell that is programmable into each of the more than two states; and
a circuit, wherein the first temperature budget sensor is written to one of the more than two states and the circuit compares a first signal from the first temperature budget sensor to a first resistivity band to obtain a first result, and refreshes the plurality of multi-bit memory cells based on the first result.

16. The semiconductor device of claim 15, comprising:
a second temperature budget sensor that includes a second multi-bit memory cell that is programmable into each of the more than two states, wherein the second temperature budget sensor is written to another one of the more than two states and the circuit compares a second signal from the second temperature budget sensor to a second resistivity band to obtain a second result, and refreshes the plurality of multi-bit memory cells based on the second result.

17. The semiconductor device of claim 15, wherein the plurality of multi-bit memory cells comprises a plurality of multi-bit phase change memory cells, wherein each of the plurality of multi-bit phase change memory cells includes at least one of Ge, Sb, Te, Ga, As, In, Se, and S.

18. A memory comprising:
an array of multi-bit phase change memory cells, wherein each of the multi-bit phase change memory cells is programmable into each of more than two states;
means for monitoring a temperature budget of the array of multi-bit phase change memory cells; and
means for refreshing the array of multi-bit phase change memory cells in response to the temperature budget exceeding a threshold value.

19. The memory of claim 18, comprising:
means for sensing a signal from the means for monitoring the temperature budget; and
means for comparing the signal to a reference signal to obtain a comparison result that indicates whether the temperature budget exceeds the threshold value.

20. The memory of claim 18, wherein the means for monitoring the temperature budget comprises:
means for monitoring the temperature budget with the memory powered down.

21. The memory of claim 18, wherein the means for monitoring the temperature budget comprises:
   means for monitoring one of the more than two states via a resistivity band.

22. The memory of claim 18, wherein the means for monitoring the temperature budget comprises:
   means for monitoring one state having a larger sensitivity factor than other states of the more than two states.

23. The memory of claim 18, wherein the means for monitoring the temperature budget comprises:
   means for monitoring each of the non-crystalline states of the more than two states.

24. A method of operating a memory, comprising:
   monitoring a temperature budget of an array of multi-bit phase change memory cells that are programmable into each of more than two states; and
   refreshing the array of multi-bit phase change memory cells in response to the temperature budget exceeding a threshold value.

25. The method of claim 24, comprising:
   sensing a signal from a temperature budget sensor; and
   comparing the signal to a reference signal to obtain a comparison result that indicates whether the temperature budget exceeds the threshold value.

26. The method of claim 24, wherein monitoring the temperature budget comprises:
   monitoring the temperature budget with the memory powered down.

27. The method of claim 24, wherein monitoring the temperature budget comprises:
   monitoring one of the more than two states via a resistivity band.

28. The method of claim 24, wherein monitoring the temperature budget comprises:
   monitoring one state having a larger sensitivity factor than other states of the more than two states.

29. The method of claim 24, wherein monitoring the temperature budget comprises:
   monitoring each of the non-crystalline states of the more than two states.

30. The method of claim 24, wherein monitoring the temperature budget comprises:
   monitoring each of the more than two states.

31. A method of operating a memory, comprising:
   writing a first multi-bit phase change memory cell to substantially a lower resistance end of a first state of more than two states;
   sensing a first signal from the first multi-bit phase change memory cell;
   comparing the first signal to a first reference signal to obtain a first comparison result; and
   refreshing an array of multi-bit phase change memory cells based on the first comparison result.

32. The method of claim 31, wherein writing the first multi-bit phase change memory cell comprises:
   writing the first multi-bit phase change memory cell to substantially a lower resistance end of one non-crystalline state having a larger sensitivity factor than other non-crystalline states of the more than two states.

33. The method of claim 31, comprising:
   writing a second multi-bit phase change memory cell to substantially a lower resistance end of a second state of the more than two states;
   sensing a second signal from the second multi-bit phase change memory cell;
   comparing the second signal to a second reference signal to obtain a second comparison result; and
   refreshing the array of multi-bit phase change memory cells based on the second comparison result.

34. The method of claim 33, wherein writing the first multi-bit phase change memory cell comprises writing the first multi-bit phase change memory cell to substantially a lower resistance end of a first non-crystalline state and writing the second multi-bit phase change memory cell comprises writing the second multi-bit phase change memory cell to substantially a lower resistance end of a second non-crystalline state of the more than two states.

35. The method of claim 33, comprising:
   writing a third multi-bit phase change memory cell to substantially a lower resistance end of a third state of the more than two states;
   sensing a third signal from the third multi-bit phase change memory cell;
   comparing the third signal to a third reference signal to obtain a third comparison result; and
   refreshing the array of multi-bit phase change memory cells based on the third comparison result.

* * * * *